United States Patent
Zhou et al.

(10) Patent No.: US 11,758,767 B2
(45) Date of Patent: Sep. 12, 2023

(54) DISPLAY SUBSTRATE AND DISPLAY PANEL

(71) Applicants: Chengdu BOE Optoelectronics Technology Co., Ltd., Sichuan (CN); BOE TECHNOLOGY GROUP CO., LTD., Beijing (CN)

(72) Inventors: Da Zhou, Beijing (CN); Taoran Zhang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/762,048

(22) PCT Filed: May 12, 2021

(86) PCT No.: PCT/CN2021/093288
§ 371 (c)(1),
(2) Date: Mar. 18, 2022

(87) PCT Pub. No.: WO2021/254036
PCT Pub. Date: Dec. 23, 2021

(65) Prior Publication Data
US 2022/0344430 A1    Oct. 27, 2022

(30) Foreign Application Priority Data
Jun. 18, 2020    (CN) .......................... 202010559645.4

(51) Int. Cl.
*H10K 59/121*    (2023.01)
*G09G 3/3233*    (2016.01)
(Continued)

(52) U.S. Cl.
CPC ....... *H10K 59/1216* (2023.02); *G09G 3/3233* (2013.01); *H10K 50/81* (2023.02);
(Continued)

(58) Field of Classification Search
CPC .... H10K 59/1216; H10K 59/35; H10K 50/81; H10K 59/1315; H10K 59/12;
(Continued)

(56) References Cited

U.S. PATENT DOCUMENTS

2016/0163247 A1    6/2016    Lee et al.
2020/0075702 A1*   3/2020    Zhang .................... H10K 59/35
2020/0202780 A1*   6/2020    Asano .................... H01L 33/08

FOREIGN PATENT DOCUMENTS

CN    101313349 A    11/2008
CN    207320119 U    5/2018
(Continued)

OTHER PUBLICATIONS

China Patent Office, First Office Action dated Aug. 16, 2022 for application No. CN202010559645.4.

*Primary Examiner* — Douglas M Wilson
(74) *Attorney, Agent, or Firm* — HOUTTEMAN LAW LLC (57) ABSTRACT

An embodiment of the present disclosure provides a display substrate, including: pixels including light-emitting devices, at least some pixels each include a light-emitting device of a first color, which includes a cathode and an anode; and an anode connector for supplying power to the anode of each light-emitting device through an anode line, a total resistance of the anode line connected between any light-emitting device and the anode connector is the supply resistance of the light-emitting device, coupling capacitance values of the anodes of at least some of the light-emitting devices of the first color are different; for any two light-emitting devices of the first color having anodes with different coupling capacitance values, the supply resistance of the light-emitting device having the anode with a larger coupling capacitance value is smaller than the supply resistance of the light-
(Continued)

emitting device having the anode with a smaller coupling capacitance value.

20 Claims, 7 Drawing Sheets

(51) Int. Cl.
    *H10K 50/81*     (2023.01)
    *H10K 59/35*     (2023.01)
    *G09G 3/3225*     (2016.01)
    *H10K 59/12*     (2023.01)
    *H10K 59/131*     (2023.01)

(52) U.S. Cl.
    CPC ... *G09G 3/3225* (2013.01); *G09G 2300/0819* (2013.01); *G09G 2300/0842* (2013.01); *G09G 2300/0861* (2013.01); *G09G 2300/0876* (2013.01); *G09G 2320/0223* (2013.01); *G09G 2320/0233* (2013.01); *G09G 2320/0242* (2013.01); *G09G 2330/021* (2013.01); *H10K 59/12* (2023.02); *H10K 59/1315* (2023.02); *H10K 59/35* (2023.02); *H10K 59/351* (2023.02)

(58) Field of Classification Search
    CPC .. H10K 59/351; H10K 59/352; H10K 59/353; G09G 3/3233; G09G 2300/0842; G09G 2320/0223; G09G 2320/0233; G09G 2320/0242; G09G 2330/021; G09G 2300/0819; G09G 2300/0861; G09G 2300/0876; G09G 2310/0251; G09G 3/3225
    See application file for complete search history.

(56) References Cited

FOREIGN PATENT DOCUMENTS

| | | |
|---|---|---|
| CN | 110690360 A | 1/2020 |
| CN | 111668273 A | 9/2020 |
| JP | 2001230163 A | 8/2001 |

\* cited by examiner

DISPLAY SUBSTRATE AND DISPLAY PANEL

TECHNICAL FIELD

Embodiments of the present disclosure relate to the field of display technology, and in particular, to a display substrate and a display panel.

BACKGROUND

In an Organic Light-emitting Diode (OLED) display panel, each pixel (or sub-pixel) includes an OLED, and an anode port of a driving chip (IC) is electrically connected to an anode connector to supply power to an anode of the OLED of each pixel through an anode line, that is, to supply an anode voltage Vdd to the anode of the OLED.

Obviously, the anode line has a certain resistivity, so there is a certain voltage drop (IR Drop) when a signal propagates therein, and the longer the propagation distance, the larger the voltage drop. Therefore, the farther from the IC, the lower the anode voltage Vdd actually obtained by the OLED in the pixel, i.e., the lower a cross-voltage Vds. The cross-voltage is the difference between the anode voltage Vdd and a cathode voltage Vss of the OLED.

Under a same data voltage (in other words, a same gray scale), the lower the cross-voltage, the lower the brightness of the OLED, which results in the fact that under the same condition, the farther from the IC, the lower the brightness of the pixel, so that brightness difference occurs at different positions of the display panel, i.e. a "bright-dark screen" phenomenon occurs, and the long-range uniformity (LRU) is poor, and the display effect is poor. Moreover, the above "bright-dark screen" phenomenon is more obvious in a High Brightness Mode (HBM).

In particular, the brightness of the OLEDs with different colors varies in different laws with the anode voltage Vdd (in other words, the cross-voltage Vds), which results in that when white balance (i.e., light emitted by the pixels with different colors at the same gray level can be mixed into a white light) is achieved at a certain position of the display panel, the components of the different colors at other positions of the display panel are not matched, and white balance cannot be achieved. For example, when white balance is achieved at a certain position of the display panel, a position closer to the IC than the certain position may be reddish (pinkish) and a position farther from the IC than the certain position may be cyan (greenish), resulting in a "redness/cyanness" phenomenon.

SUMMARY

The embodiments of present disclosure provides a display substrate and a display panel.

In a first aspect, an embodiment of the present disclosure provides a display substrate, including:
a plurality of pixels including light-emitting devices, wherein at least a portion of the plurality of pixels each include a light-emitting device of a first color, which includes a cathode and an anode; and
an anode connector for supplying power to the anode of each of the light-emitting devices through an anode line, a total resistance of the anode line connected between the light-emitting device and the anode connector being a supply resistance of this light-emitting device, wherein
coupling capacitance values of the anodes of at least some of the light-emitting devices of the first color are different; for any two light-emitting devices of the first color having the anodes with different coupling capacitance values, the supply resistance of the light-emitting device having the anode with a larger coupling capacitance value is smaller than the supply resistance of the light-emitting device having the anode with a smaller coupling capacitance value.

In some embodiments, the display substrate is divided into n compensation regions, each of which includes a plurality of light-emitting devices of the first color, wherein n is an integer greater than or equal to 2;
coupling capacitance values of the anodes of the light-emitting devices of the first color in a same compensation region are the same; and
a maximum value of the supply resistance of the light-emitting device of the first color in the $i^{th}$ compensation region is smaller than a minimum value of a supply resistance of the light-emitting device of the first color in the $(i+1)^{th}$ compensation region; a coupling capacitance value of the anode of the light-emitting device of the first color in the $i^{th}$ compensation region is greater than a coupling capacitance value of the anode of the light-emitting device of the first color in the $(i+1)^{th}$ compensation region; wherein i is any integer greater than 0 and less than n.

In some embodiments, all of the plurality of pixels are arranged in a display area, and the anode connector is arranged outside one side of the display area; and
the $i^{th}$ compensation region and the $(i+1)^{th}$ compensation region are separated by a boundary, the $i^{th}$ compensation region is on a side of the boundary close to the anode connector, and the $(i+1)^{th}$ compensation region is on a side of the boundary away from the anode connector.

In some embodiments, an area of the anode of any of the light-emitting devices of the first color in the $i^{th}$ compensation region is larger than an area of the anode of any of the light-emitting devices of the first color in the $(i+1)^{th}$ compensation region.

In some embodiments, n is equal to 3.

In some embodiments, the light-emitting device is an organic light-emitting diode.

In some embodiments, the first color is red.

In some embodiments, the display substrate further includes a plurality of light-emitting devices of other colors different from the first color; and
coupling capacitance values of the anodes of the light-emitting devices of a same color of the other colors, except for the light-emitting devices of the first color, are the same.

In some embodiments, the display substrate further includes a base substrate, wherein
each of the plurality of pixels further includes a driving circuit for driving the light-emitting device, the driving circuit including a plurality of conductive structures, and any conductive structure of the plurality of conductive structures insulated from the anode of the light-emitting device is a potential capacitor structure;
in each of the plurality of pixels, an orthographic projection of the anode of the light-emitting device on the base substrate overlaps an orthographic projection of at least a part of the potential capacitor structure on the base substrate; and
for any two light-emitting devices of the first color having the anodes with different coupling capacitance values, an overlapping area between the orthographic projection of the anode of the light-emitting device, with a larger coupling capacitance value of the anode, and the orthographic projection of the potential capacitor structure, is larger than an overlapping area between the orthographic projection of the anode of the light-emitting device, with a smaller coupling capacitance value of the anode, and the orthographic projection of the potential capacitor structure.

In some embodiments, throughout all the pixels where the light-emitting devices of the first color are located, shapes of the orthographic projections of the potential capacitor structures on the base substrate are the same; and for any two light-emitting devices of the first color with different coupling capacitance values of the anodes, an area of the orthographic projection of the anode, which has a larger coupling capacitance value, of the light-emitting device on the base substrate, is larger than an area of the orthographic projection of the anode, which has a smaller coupling capacitance value, of the light-emitting device on the base substrate.

In some embodiments, each of the light-emitting devices further includes a light-emitting layer between the cathode and the anode, and the anodes of all the light-emitting devices each include a main body part in contact with the light-emitting layer;

shapes of the main body parts of the anodes of all the light-emitting devices of the first color are the same; and except the anode, which has a smallest coupling capacitance value, of the light-emitting device of the first color, each of the anodes of the light-emitting devices of the first colors includes a compensation part extending outward from an edge of the main body part, and the larger the coupling capacitance value of the anode of the light-emitting device is, the larger the area of the compensation part corresponding to the light-emitting device is.

In some embodiments, the cathode of the light-emitting device is arranged on a side of the anode, away from the base substrate; and the potential capacitor structure, the orthographic projection of which has an overlap with the orthographic projection of the anode of the light-emitting device, is located between the anode and the base substrate, and is separated from the anode by at least one insulating layer.

In a second aspect, an embodiment of the present disclosure provides a display panel, which includes:

any one of the above described display substrates.

In some embodiments, the display panel further includes: a driving chip having an anode port electrically connected to the anode connector of the display substrate.

BRIEF DESCRIPTION OF DRAWINGS

The accompanying drawings, which are included to provide a further understanding of the present disclosure and constitute a part of this specification, serve to explain the present disclosure together with the following detailed description, but do not constitute a limitation of the present disclosure. The above and other features and advantages will become more apparent to one of ordinary skill in the art by describing detailed examples with reference to the accompanying drawings, in which.

Reference signs are:

1. a pixel; 11. a potential capacitor structure; 18. a pixel defining layer; 19. an insulating layer; 2. a light-emitting device; 21. an anode; 211. a main body part; 212. a compensation part; 22. a cathode; 23. a light-emitting layer; 3. an anode line; 5. an anode connector; 9. a base substrate; 91. a display area; t1. a first transistor; t2. a second transistor; t3. a third transistor; t4. a fourth transistor; t5. a fifth transistor; t6. a sixth transistor; t7. a seventh transistor; Cst. storage capacitor; Reset. first reset terminal; Reset'. second reset terminal; Vinit. initialization terminal; Gate. gate line terminal; Data. data line terminal; EM. a control terminal; VDD. anode signal terminal; VSS. cathode signal terminal.

DETAIL DESCRIPTION OF EMBODIMENTS

In order to enable one of ordinary skill in the art to better understand the technical solutions of the embodiments of the present disclosure, a display substrate and a display panel provided in the embodiments of the present disclosure are described in detail below with reference to the accompanying drawings.

The embodiments of the present disclosure will be described more fully hereinafter with reference to the accompanying drawings, and may be embodied in different forms and should not be construed as limited to the embodiments set forth herein. Rather, these embodiments are provided so that this disclosure will be thorough and complete, and will fully convey the scope of the present disclosure to one of ordinary skill in the art.

The embodiments of the present disclosure may be described with reference to plan and/or cross-sectional views by way of idealized schematic illustrations of the present disclosure. Accordingly, the example illustrations may be modified in accordance with manufacturing techniques and/or tolerances.

The embodiments of the present disclosure and features in the embodiments may be combined with each other without conflict.

The term used herein is for the purpose of describing particular embodiments only and is not intended to limit the present disclosure. As used herein, the term "and/or" includes any and all combinations of one or more of the associated listed items. As used herein, the singular forms "a", "an" and "the" are intended to include the plural forms as well, unless the context clearly indicates otherwise. As used herein, the term "comprises", "comprising" or "made of . . . ", specifies the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The embodiments of the present disclosure are not limited to the embodiments shown in the drawings, but include modifications of configurations formed based on a manufacturing process. Thus, the regions illustrated in the figures have schematic properties, and the shapes of the regions shown in the figures illustrate specific shapes of regions of elements, but are not intended to be limiting.

In a first aspect, referring to FIGS. 1 to 11, an embodiment of the present disclosure provides a display substrate, including:

a plurality of pixels 1 including light-emitting devices 2, wherein at least a portion of the pixels 1 include a light-emitting device 2 of a first color, the light-emitting device 2 includes a cathode 22 and an anode 21; and an anode connector 5 for supplying power to the anode 21 of each light-emitting device 2 through an anode line 3, wherein a total resistance of the anode line 3 connected between any light-emitting device 2 and the anode connector 5 is a supply resistance of this light-emitting device 2.

Figure 1:
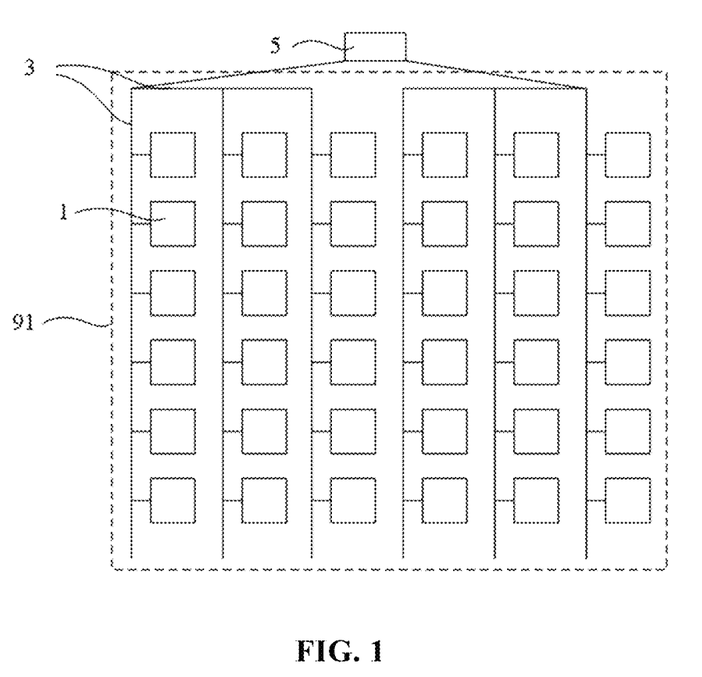
FIG. 1 is a schematic diagram illustrating a structure of a display substrate according to an embodiment of the present disclosure.
Figure 2:
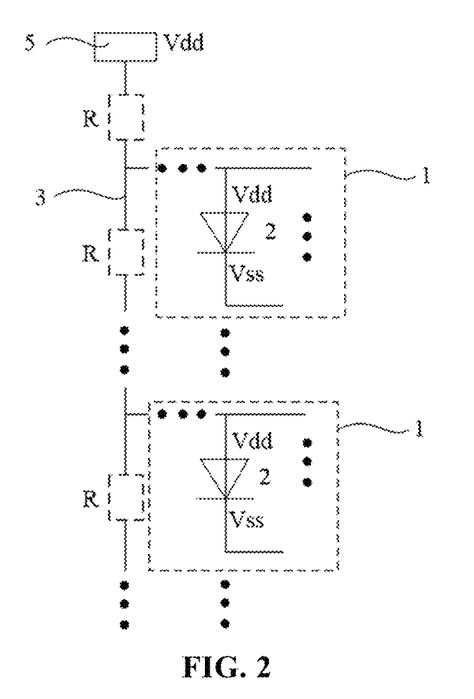
FIG. 2 is a schematic diagram illustrating a principle that different light-emitting devices correspond to different supply resistances in a display substrate according to an embodiment of the present disclosure.

Referring to FIGS. 1 and 2, a display substrate according to an embodiment of the present disclosure includes a plurality of pixels 1 (or sub-pixels), each pixel 1 includes a light-emitting device 2, and the light-emitting device 2 in each pixel can be independently driven and emit light with a specific brightness, so that the corresponding pixel 1 displays a specific content, and each pixel 1 is a minimum "dot" in the display substrate that can be independently controlled.

Furthermore, the light-emitting device 2 in each pixel 1 has a specific color, i.e.

the light-emitting device 2 emits light of a specific color, so that each pixel 1 has a corresponding color as well. Furthermore, at least some of the light-emitting devices 2 in the pixels 1 are of a first color (e.g. red), i.e. the display substrate includes light-emitting devices 2 of the first color.

Alternatively, it will be understood that if the light-emitting devices 2 in all pixels 1 in the display substrate are of one color (e.g. white), then that color is the first color.

Alternatively, the display substrate may also include light-emitting devices 2 of other colors than the first color, so that light emitted from a plurality of light-emitting devices 2 of different colors (e.g., red, green, blue) may be mixed to realize a color display.

The light-emitting device 2 in each pixel 1 includes an anode 21 and a cathode 22 (may further include a light-emitting layer 23). In order to supply power to the anode 21 of the light-emitting device 2, an anode connector 5 (e.g., for being electrically connected to an anode port of the driving chip) is further provided in the display substrate, and the anode connector 5 is connected to each pixel 1 through an anode line 3, so that an anode voltage (Vdd) may be supplied to the anode 21 of each light-emitting device 2.

Alternatively, the display substrate may also have a structure for supplying power to the cathode 22 of the light-emitting device 2, which will not be described in detail herein.

Obviously, the anode line 3 has a certain resistivity, so that with reference to FIG. 2, each segment of the anode line 3 corresponds to an equivalent resistor (denoted by R in FIG. 2). Thus, the farther a light-emitting device 2 is from the anode connector 5, the greater the length of a part of the anode line 3 between this light-emitting device 2 and the anode connector 5, the greater a corresponding actual resistance value, which is defined as the supply resistance of this light-emitting device 2.

Obviously, the greater the resistance through which a signal propagates in the line is, the greater the corresponding voltage drop (IR Drop) is. Thus, referring to FIG. 2, the farther a pixel 1 is from the anode connector 5, the greater the supply resistance of the light-emitting device 2, the greater the corresponding voltage drop, and thus the lower the anode voltage Vdd actually obtained by the anode 21 of the light-emitting device 2, and thus the lower the cross-voltage Vds (i.e., the difference between the anode voltage Vdd and the cathode voltage Vss). Under the same other conditions (e.g., the same gray scale), the lower the cross-voltage Vds, the lower the brightness of the light-emitting device 2.

Figure 3:
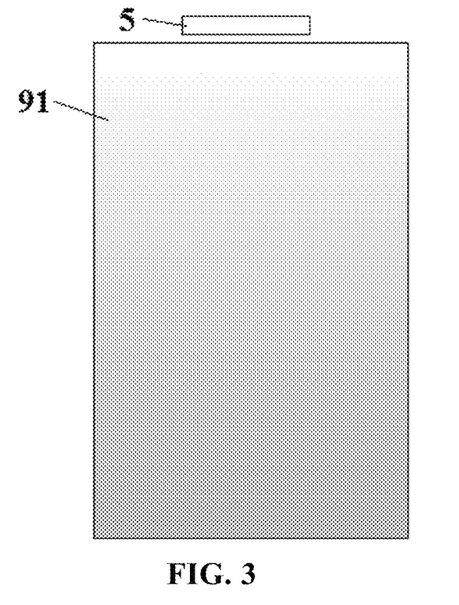
FIG. 3 is a schematic diagram illustrating a phenomenon of uneven brightness in a display panel in the related art.

Thus, referring to FIG. 3, in some display panels in the related art, when the theoretical display brightness is the same (the gray scale is the same), a phenomenon, in which the pixel 1 closer to the anode connector 5 is bright (due to the higher cross-voltage Vds), and the pixel 1 farther from the anode connector 5 is dark (due to the lower cross-voltage Vds), occurs, that is, a "bright-dark screen" phenomenon occurs, so that the long-range uniformity (LRU) of the display panel is poor, and the display effect is poor.

In particular, the above "bright-dark screen" phenomenon is more obvious in the High Brightness Mode (HBM) (in other words, when the gray scale is high).

In the display substrate according to an embodiment of the present disclosure, the coupling capacitance values of the anodes 21 of at least some of the light-emitting devices 2 of the first color are different; for any two light-emitting devices 2 of the first color having the anodes 21 with different coupling capacitance values, the supply resistance of the light-emitting device 2 having the anode 21 with a larger coupling capacitance value is smaller than the supply resistance of the light-emitting device 2 having the anode 21 with a smaller coupling capacitance value.

Figure 6:
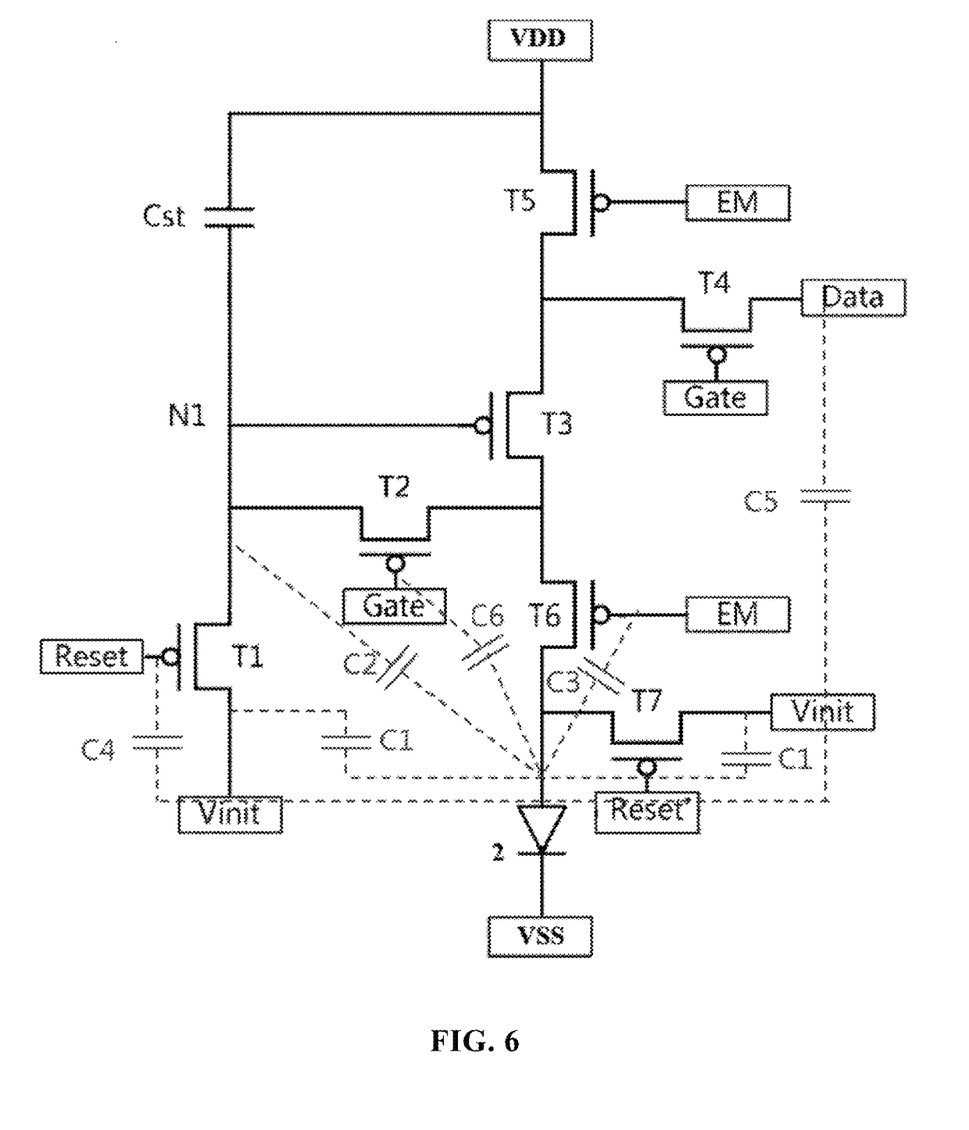
FIG. 6 is a circuit diagram of a driving circuit of a pixel in a display substrate according to an embodiment of the present disclosure.

Referring to FIG. 6, the anode 21 of each light-emitting device 2 is necessarily close to other conductive structures in the pixel 1 to form capacitors (C1 to C6 in the figure), which are "coupling capacitors" of the anode 21 of the light-emitting device 2, and the coupling capacitors also affect the brightness of the light-emitting device 2.

In the display substrate according to the embodiment of the present disclosure, at least some of the light-emitting devices 2 in the plurality of light-emitting devices 2 of the first color have different structures, so that the coupling capacitance values of the anodes 21 of different light-emitting devices 2 are also different, and the general rule is as follows: the larger the supply resistance (in other words, the farther away from the anode connector 5) of the light-emitting device 2, the smaller the coupling capacitance value of the anode 21. Alternatively, this general rule does not require that the coupling capacitance values of all the light-emitting devices 2 with different supply resistances are all different.

For example, in an embodiment of the present disclosure, the light-emitting device 2 may be an Organic Light-emitting Diode (OLED), and each pixel 1 further includes a corresponding driving circuit, and with reference to FIG. 6, the structure of the driving circuit may be a 7T1C structure. The above driving circuit includes a first transistor T1, a second transistor T2, a third transistor T3, a fourth transistor T4, a fifth transistor T5, a sixth transistor T6, a seventh transistor T7, a storage capacitor Cst, a first reset terminal Reset, a second reset terminal Reset', an initialization terminal Vinit, a gate line terminal Gate, a data line terminal Data, a control terminal EM, an anode signal terminal VDD, a cathode signal terminal VSS, etc.; each transistor may be a P-type transistor (e.g., PMOS), the anode signal terminal VDD is connected to the anode line 3, and other terminals are respectively connected to corresponding power supply structures (e.g., a control line, a gate line, a data line, a reset line, etc.).

As is known from the light-emitting principle of the OLED, the brightness thereof is positively correlated with the driving current Ioled flowing therethrough. The calculation formula of the driving current Ioled is:

$$Ioled=0.5 \times K \times (Vgs-Vth)^2;$$

where K is a fixed coefficient, Vth is the threshold voltage of the driving transistor (i.e., the third transistor T3), and Vgs is the gate-source voltage of the driving transistor (i.e., the third transistor T3), i.e., the difference between the voltage at the node N1 and the voltage of the source of the third transistor T3. When other conditions are the same (e.g., the data voltage and the cross-voltage Vds are the same), the larger the coupling capacitance value of the anode 21 of the light-emitting device 2 (OLED) is, the lower the voltage at the node N1 is, and thus the smaller the gate-source voltage Vgs is, the smaller the corresponding driving current Ioled is, and the lower the brightness of the light-emitting device 2 (OLED) is.

In the display substrate according to the embodiment of the present disclosure, the coupling capacitance value of the anode 21 of the light-emitting device 2 having a smaller supply resistance (in other words, closer to the anode connector 5) is increased, or in other words, a "compensation (capacitance compensation)" is performed on the light-emitting device 2 having a smaller supply resistance.

As described above, the voltage drop Vds corresponding to the light-emitting device 2 with a smaller supply resistance (closer to the anode connector 5) is smaller, so the light-emitting brightness should be higher; in an embodiment of the present disclosure, the coupling capacitance value of the anode 21 of the light-emitting device 2 having the smaller supply resistance is larger, which may reduce the brightness of the light-emitting device 2, and thus, the brightness deviation of the light-emitting device 2 may be avoided by the combined influence of the supply resistance and the coupling capacitance value.

Therefore, in an embodiment of the present disclosure, the coupling capacitance values of the anodes 21 of different light-emitting devices 2 are different (in other words, compensated differently), so as to offset the influence of the difference in the supply resistances on the brightness of the pixel 1 to a certain extent. That is, the difference in the coupling capacitance values is equivalent to reducing the brightness of the originally brighter pixel 1, and increasing the brightness of the originally darker pixel 1, so that the brightness of the pixels 1 at different positions from the anode connector 5 in the display panel is relatively uniform, the "bright-dark screen" phenomenon is eliminated, the long-range uniformity (LRU) of the display panel is improved, and the display effect is improved.

Especially, the display effect is improved more significantly according to the embodiments of the present disclosure in a High Brightness Mode (HBM) (in other words, when the gray scale is higher).

In addition, since the brightness uniformity is improved through the compensation, the cathode voltage Vss supplied to the cathode 22 of each light-emitting device 2 can be lower, which is advantageous for reducing power consumption of the display panel during display.

In some embodiments, the light-emitting device 2 is an organic light-emitting diode.

In some embodiments, the first color is red.

That is, the light-emitting device 2 in the display substrate may be specifically an Organic Light-emitting Diode (OLED), and the display substrate may be an OLED display substrate. Accordingly, the first color may be red in this case, that is, in the OLED display substrate, at least the red pixels 1 are compensated as described above.

Figure 4:
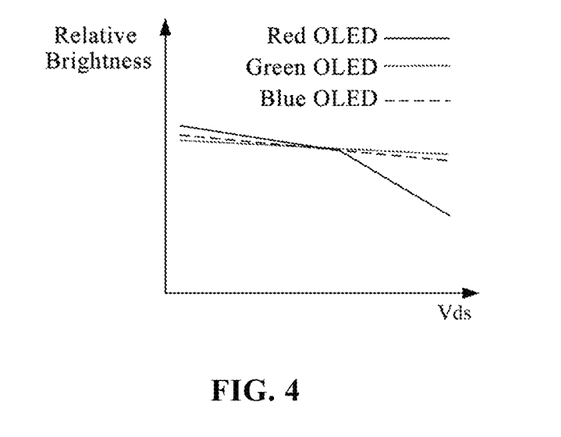
FIG. 4 is a schematic diagram illustrating a relationship between the brightness and the cross-voltage of OLEDs with different colors.

Due to limitations of the luminesce materials and the like, referring to FIG. 4, the brightness of the red OLED varies with the anode voltage Vdd differently from the brightness of OLEDs of other colors (e.g., blue or green), which may cause color non-uniformity at different positions of the display panel, such as the above "redness/cyanness" phenomenon.

Figure 5:
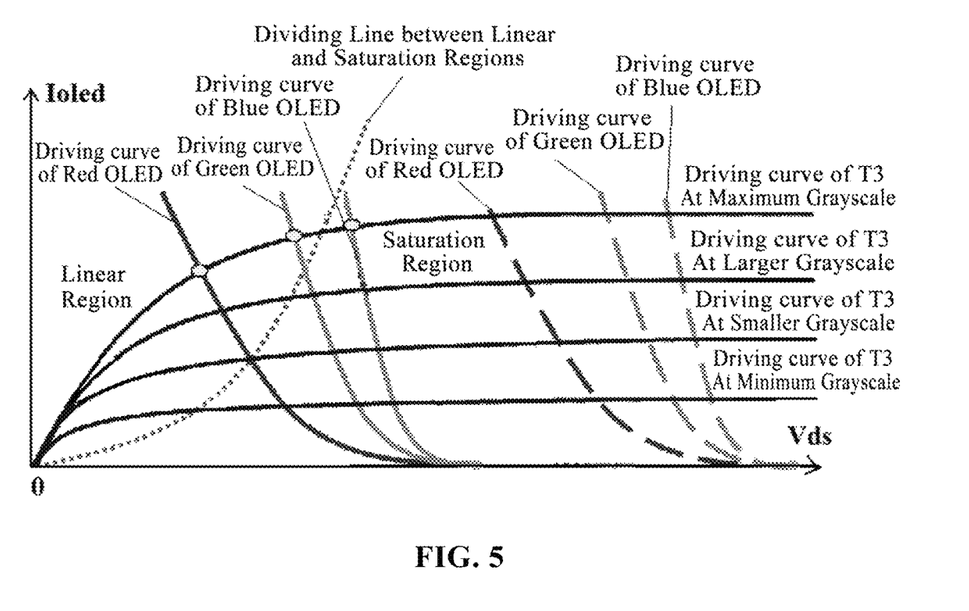
FIG. 5 is a schematic diagram illustrating a relationship between the driving current and the cross-voltage of OLEDs with different colors.

Referring to FIG. 5, under different anode voltages Vdd (i.e., different cross-voltages Vds), the driving curves of OLEDs of different colors are different, and further, the intersection points between the driving curves (T3 driving curves) of the driving transistors (e.g., the third transistor T3) under a certain gray scale (in other words, a certain threshold voltage Vgs) and the driving curves of the OLEDs of different colors are different, and the driving currents Ioled corresponding to the intersection points are also different, i.e., the OLEDs of different colors having different light-emitting brightness.

Referring to FIG. 5, it can be seen that, for the blue OLED and the green OLED, the driving curves under different cross-voltages Vds substantially intersect the saturation regions of the driving curves of the driving transistor T3, so that, referring to FIG. 4, the brightness of the blue OLED and the green OLED does not vary obviously with the cross-voltage Vds and is substantially straight.

In contrast, referring to FIG. 5, the driving curves of the red OLED under some cross-voltages Vds intersect the linear regions of the driving curves of the driving transistor T3, and the driving current Ioled corresponding to the intersection point in this case may significantly vary as the cross-voltage Vds varies; therefore, referring to FIG. 4, the brightness of the red OLED obviously varies with the cross-voltage Vds, and is a polyline (two parts of the polyline correspond to the saturation region and the linear region, respectively).

It can be seen that the red OLED is a main factor causing color deviation and brightness difference, and therefore, in the display substrate according to the embodiment of the present disclosure, at least the coupling capacitance values of the anodes 21 of the red light-emitting devices 2 need to be different, or in other words, at least the red light-emitting devices 2 need to be "compensated".

In some embodiments, the display substrate further includes a plurality of light-emitting devices 2 of other colors than the first color; the coupling capacitance values of the anodes 21 of the light-emitting devices 2 of any other colors rather than the light-emitting devices 2 of the first color are the same.

As described above, in addition to the light-emitting devices 2 (e.g. OLEDs) of the first color (e.g. red), light-emitting devices 2 (e.g. OLEDs) of other colors (e.g. blue, green) may be included in the display substrate; and from the viewpoint of simplifying a structure, in the light-emitting devices 2 of the other colors than the first color, the coupling capacitance values of the anodes 21 of the light-emitting devices 2 of the same color may be the same (because the brightness deviation of the light-emitting devices 2 of these colors is small), that is, it is not necessary to "compensate" the light-emitting devices 2 of the other colors.

Alternatively, it should be understood that it is also possible to have different coupling capacitance values for the anodes 21 of the light-emitting devices 2 of the other colors; and the changing rule of the coupling capacitance values of the anodes 21 of the light-emitting devices 2 of the other colors may be the same as the changing rule of the coupling capacitance values of the anodes 21 of the light-emitting devices 2 of the first color. That is, similarly, for any two light-emitting devices 2 of one color having anodes 21 with different coupling capacitance values, the supply resistance of the light-emitting device 2 having the anode 21 with a larger coupling capacitance value is smaller than the supply resistance of the light-emitting device 2 having the anode 21 with a smaller coupling capacitance value.

In some embodiments, the display substrate is divided into n compensation regions, each compensation region includes a plurality of light-emitting devices 2 of the first color, wherein n is an integer greater than or equal to 2.

The coupling capacitance values of the anodes 21 of the light-emitting devices 2 of the first color in the same compensation region are the same.

The maximum value of the supply resistance of the light-emitting device 2 of the first color in the $i^{th}$ compensation region is smaller than the minimum value of the supply resistance of the light-emitting device 2 of the first color in the $(i+1)^{th}$ compensation region; the coupling capacitance value of the anode 21 of the light-emitting device 2 of the first color in the $i^{th}$ compensation region is larger than the coupling capacitance value of the anode 21 of the light-emitting device 2 of the first color in the $(i+1)^{th}$ compensation region; wherein i is an integer greater than 0 and less than n.

Theoretically, it is most advantageous to set a corresponding coupling capacitance value for the anode 21 of each of the light-emitting devices 2 according to the anode voltage Vdd actually obtained, but in practice, it is difficult to set all of the numerous light-emitting devices 2 to have different structures to obtain the desired coupling capacitance values, both in terms of design and process.

Figure 7:
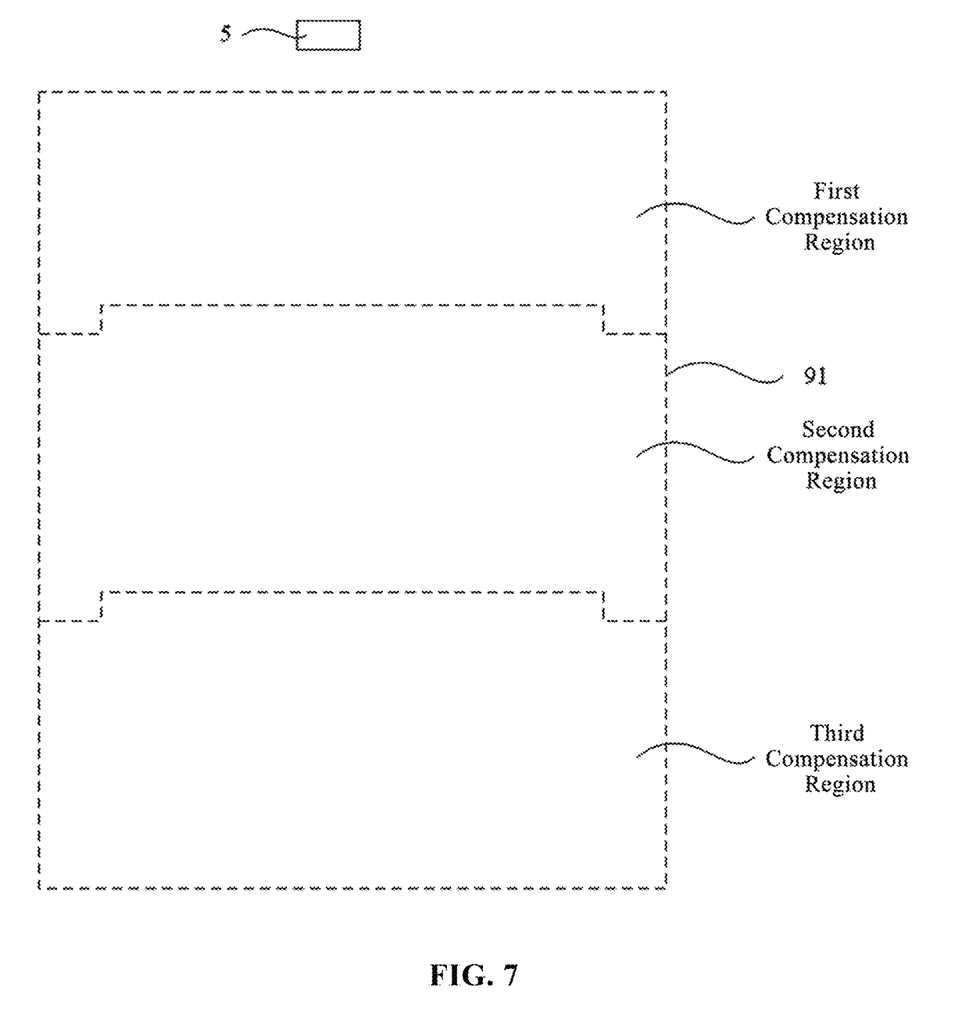
FIG. 7 is a schematic diagram illustrating how to divide compensation regions in a display substrate according to an embodiment of the present disclosure.

Therefore, referring to FIG. 7, the display substrate is divided into a plurality of "compensation regions", and the pixels 1 in each compensation region are located relatively close to each other, so that the supply resistances of the light-emitting devices 2 of the pixels 1 do not differ much. Thus, in each compensation region, the structures of the light-emitting devices 2 of at least the first color (e.g. red) are the same, so that the coupling capacitance values of their anodes 21 are also all the same. At least for the light-emitting devices 2 of the first color, the coupling capacitance values of the anodes 21 of the light-emitting devices 2 of the first color in different compensation regions are different, and the larger the corresponding supply resistance in the compensation region is, the smaller the coupling capacitance value of the anode 21 of the light-emitting device 2 in the compensation region is.

That is, the compensation in the embodiment of the present disclosure may be performed by partitioning, where the compensation in each region is the same, and the compensation in different regions is different.

Alternatively, it should be understood that the compensation for the light-emitting devices 2 of the other colors may be performed by partitioning, and the compensation regions for the light-emitting devices 2 of different colors may be divided in the same or different manners.

In some embodiments, n is equal to 3.

Generally speaking, a better compensation effect can be achieved by dividing the display substrate into three compensation regions. For example, referring to FIG. 7, if the white balance of the display panel is determined to be achieved at the boundary between the second compensation region and the third compensation region, no compensation may be performed in the third compensation region, and the first compensation region is compensated to a greater extend than the second compensation region. In other words, the coupling capacitance value of the anode 21 of the light-emitting device 2 of the first color (e.g., red) in the second compensation region is "increased" with respect to the coupling capacitance value of the anode 21 of the light-emitting device 2 of the first color in the third compensation region, and the coupling capacitance value of the anode 21 of the light-emitting device 2 of the first color in the first compensation region is "increased" with respect to the coupling capacitance value of the anode 21 of the light-emitting device 2 of the first color in the second compensation region.

In some embodiments, all the pixels 1 are disposed in the display area 91, and the anode connector 5 is disposed outside one side of the display area 91; the $i^{th}$ compensation region and the $(i+1)^{th}$ compensation region are separated by a boundary, the $i^{th}$ compensation region is located on a side of the boundary close to the anode connector 5, and the $(i+1)^{th}$ compensation region is located on a side of the boundary away from the anode connector 5.

Referring to FIGS. 1 and 7, all the pixels 1 may be located in the display area 91, the anode connector 5 is located outside the display area 91 (e.g., above the display area 91 according to FIGS. 1 and 7), and the anode line 3 is connected to each light-emitting device 2 from the anode connector 5, so that the farther the light-emitting device 2 is away from the anode connector 5, the larger the supply resistance corresponding to the light-emitting device 2 is. Therefore, the above compensation regions may alternatively be divided in terms of distance from the position where the anode connector 5 is located, i.e. the closer the compensation region is to the anode connector 5, the smaller the serial number of the compensation region is, i.e. the larger the coupling capacitance value of the anode 21 of the light-emitting device 2 in the compensation region is.

The specific compensation regions may be actually set according to the uneven brightness in the actual display of the display panel product (PNL) without compensation. For example, referring to FIGS. 1 and 7, the anode connector 5 is usually located at an upper middle of the display substrate in a lateral direction, and thus the lower the pixel 1 is, the longer the anode line 3 corresponding to the pixel 1 is, and the larger the supply resistance is; in a same row, the anode lines 3 corresponding to the pixels 1 near the left and right sides are relatively shorter due to the arrangement of the anode lines 3, so that with reference to FIG. 7, the boundary of each of the different compensation regions at the left and right sides may be farther away from the side where the anode connector 5 is located than the boundary of the compensation region at a position between the left and right sides.

In some embodiments, the area of the anode 21 of any light-emitting device 2 of the first color in the $i^{th}$ compensation region is larger than the area of the anode 21 of any light-emitting device 2 of the first color in the $(i+1)^{th}$ compensation region.

Obviously, the coupling capacitor of the anode 21 is formed by overlap between the anode 21 and any other conductive structure, thus, in order to increase the coupling capacitance value of the anode 21 of the light-emitting device 2, the simplest way is to increase the area of the anode 21 (equivalent to increasing the area of one plate in the coupling capacitor), i.e. to make the area of the anode 21 of the light-emitting device 2 of the first color in the $i^{th}$ compensation region larger than the area of the anode 21 of the light-emitting device 2 of the first color in the $(i+1)^{th}$ compensation region.

In particular, how to change the coupling capacitance value by changing the area of the anode 21 will be described in detail later.

In some embodiments, the display substrate further includes a base substrate 9.

Each pixel 1 further includes a driving circuit for driving the light-emitting device 2, the driving circuit includes a plurality of conductive structures, wherein at least one conductive structure of the plurality of conductive structures insulated from the anode 21 of the light-emitting device 2 is a potential capacitor structure 11.

In each pixel 1, an orthographic projection of the anode 21 of the light-emitting device 2 on the base substrate 9 overlaps an orthographic projection of at least a part of the potential capacitor structure 11 on the base substrate 9.

For any two light-emitting devices 2 of the first color having the anodes 21 with different coupling capacitance values, an overlapping area between the orthographic projection of the anode 21 of the light-emitting device 2, with a larger coupling capacitance value of the anode 21, and the orthographic projection of the potential capacitor structure 11 is larger than an overlapping area between the orthographic projection of the anode 21 of the light-emitting device 2, with a smaller coupling capacitance value of the anode 21, and the orthographic projection of the potential capacitor structure 11.

Referring to FIG. 6, the pixel 1 is provided with a driving circuit for driving the light-emitting device 2 (such as the above described driving circuit of 7T1C), and many conductive structures in the driving circuit are insulated from the anode 21 of the light-emitting device 2 (that is, there is no conduction between these conductive structures and the anode 21 in the non-operating state), therefore these conductive structures may overlap with the anode 21 of the light emitting device 2 to form a capacitor (coupling capacitor), so they are potential capacitor structures 11.

For example, referring to FIG. 6, a plurality of potential capacitor structures 11 may form a plurality of coupling capacitors with the anode 21, specifically, capacitors C1, C2, C3, C4, C5, and C6 shown in the figure. For a specific layout design, simulation calculation shows that the relative capacitance values of the capacitors C1, C2, C3, C4, C5 and C6 are as follows:

| Capacitor serial number | C1 | C2 | C3 | C4 | C5 | C6 |
|---|---|---|---|---|---|---|
| Relative capacitance value | 8.4 | 5.1 | 2.6 | 1.2 | 2.9 | 0.3 |

It can be seen that, for this specific layout design, the coupling capacitor of the anode 21 of the light-emitting device 2 is mainly composed of the above described capacitors C1 (i.e., the capacitor between the anode 21 and the initialization terminal Vinit) and C2 (i.e., the capacitor between the anode 21 and the node N1).

Alternatively, the coupling capacitor of the anode 21 of the light-emitting device 2 may be different as for different pixel structures and layout designs.

Thereby, by adjusting the overlapping area between the potential capacitor structure 11 and the anode 21 of the light-emitting device 2, the coupling capacitance value of the anode 21 of the light-emitting device 2 can be adjusted, i.e., compensation is achieved. For example, it may be that the larger the corresponding supply resistance of the light-emitting device 2 is, the smaller the overlapping area between the potential capacitor structure 11 and the anode 21 is, i.e. the smaller the coupling capacitance value of the anode 21.

The overlapping area between the anode 21 and the potential capacitor structure 11 may be changed in various manners.

For example, it may be possible to increase/decrease the area of the anode 21 to overlap more/less of the potential capacitor structure 11 to change the overlapping area between the anode 21 and the potential capacitor structure 11.

Alternatively, the area of the potential capacitor structure 11 overlapping the anode 21 may be increased/decreased (e.g., the width of the line is increased/decreased) to change the overlapping area between the anode 21 and the potential capacitor structure 11.

Alternatively, the layout design (i.e. distribution mode) of the potential capacitor structure 11 may be changed to make a different part of the potential capacitor structure 11 overlap the anode 21, so as to change the overlapping area between the anode 21 and the potential capacitor structure 11.

In some embodiments, throughout all the pixels 1 where the light-emitting devices 2 of the first color are located, the shapes of the orthographic projections of the potential capacitor structures 11 on the base substrate 9 are the same.

For any two light-emitting devices 2 of the first color having the anodes 21 with different coupling capacitance values, an area of the orthographic projection of the anode 21, which has a larger coupling capacitance value, of the light-emitting device 2 on the base substrate 9 is larger than an area of the orthographic projection of the anode 21, which has a smaller coupling capacitance value, of the light-emitting device 2 on the base substrate 9.

Although various way may be used to change the overlapping area between the anode 21 and the potential capacitor structure 11, in the display substrate, the distribution of the conductive structures (the potential capacitor structure 11) of the driving circuit is very dense, and the gap between the conductive structures is very narrow, so it is usually difficult to change the layout or the area of the potential capacitor structure 11.

In contrast, the anodes 21 of the light-emitting devices 2 and most parts of the potential capacitor structure 11 are distributed in different layers, and the anodes 21 of different light-emitting devices 2 are independent of each other, and have a larger gap therebetween, so it is easier to change the area of the anode 21 (especially, increase the area of the anode 21 of the light-emitting device 2 to be compensated).

In some embodiments, each light-emitting device 2 further includes a light-emitting layer 23 disposed between the cathode 22 and the anode 21, and the anodes 21 of all the light-emitting devices 2 each include a main body part 211 in contact with the light-emitting layer 23.

The shapes of the main body parts of the anodes 21 of all the light-emitting devices 2 of the first color are the same.

Except the anode 21, which has the smallest coupling capacitance value, of the light-emitting device 2 of the first color, the anodes 21 of the light-emitting devices 2 of the first color each include a compensation part 212 extending outwards from an edge of the main body part 211, and the larger the coupling capacitance value of the anode 21 of the light-emitting device 2 is, the larger the area of the compensation part 212 corresponding to the light-emitting device 2 is.

Figure 9:
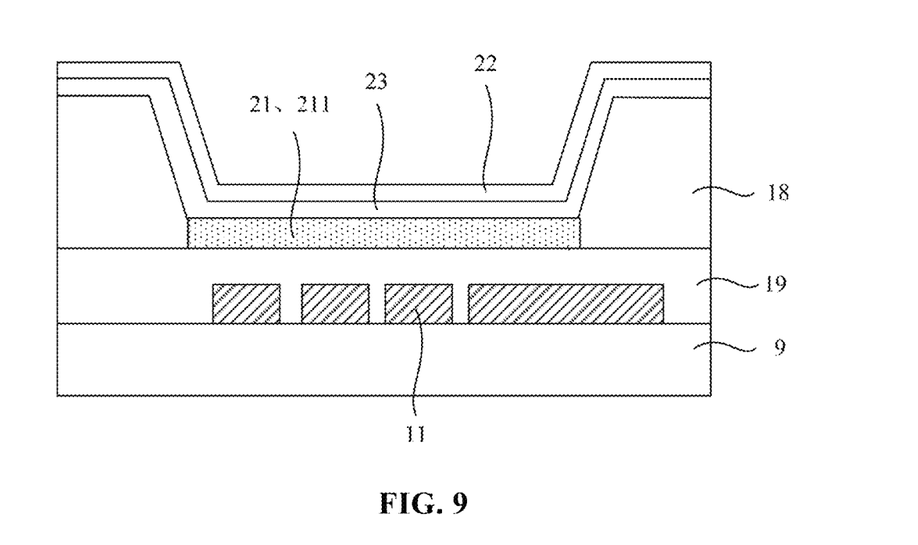
FIG. 9 is a schematic cross-sectional view taken along a line AA' in FIG. 8.
Figure 11:
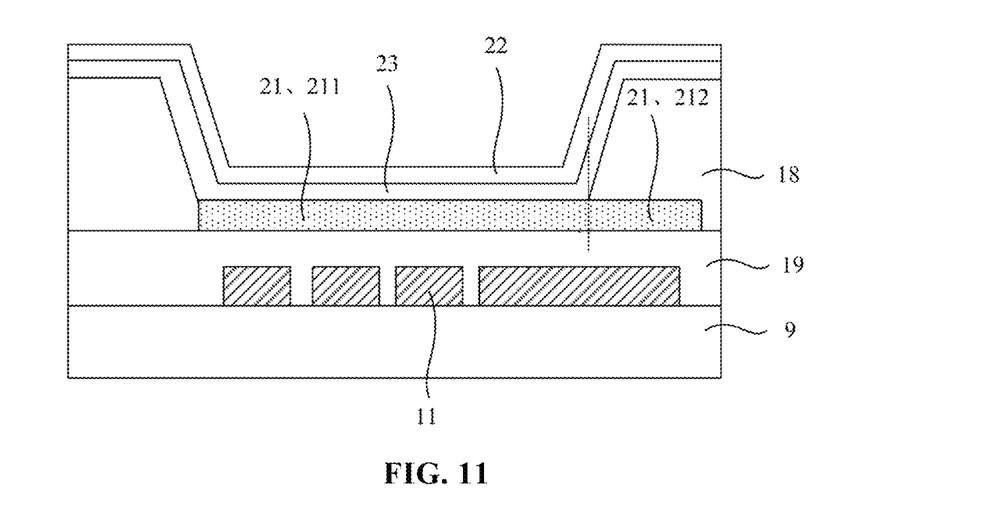
FIG. 11 is a schematic cross-sectional view taken along a line BB' in FIG. 10.

Referring to FIGS. 9 and 11, a light-emitting device 2 (e.g., an organic light-emitting diode) generally emits light through an anode 21, a light-emitting layer 23 (e.g., an organic light-emitting layer), and a cathode 22, which are stacked. When the area of the anode 21 is changed, if the contact area between the anode 21 and the light-emitting layer 23 is also increased, the light-emitting area of the light-emitting device 2 is changed, which also affects the light-emitting effect of the light-emitting device 2.

For this reason, referring to FIGS. 8 to 11, the anodes 21 in all the light-emitting devices 2 may respectively include the main body parts 211 (i.e., portions which actually emit light) which are in contact with the light-emitting layer 23 and have a same shape.

Figure 8:
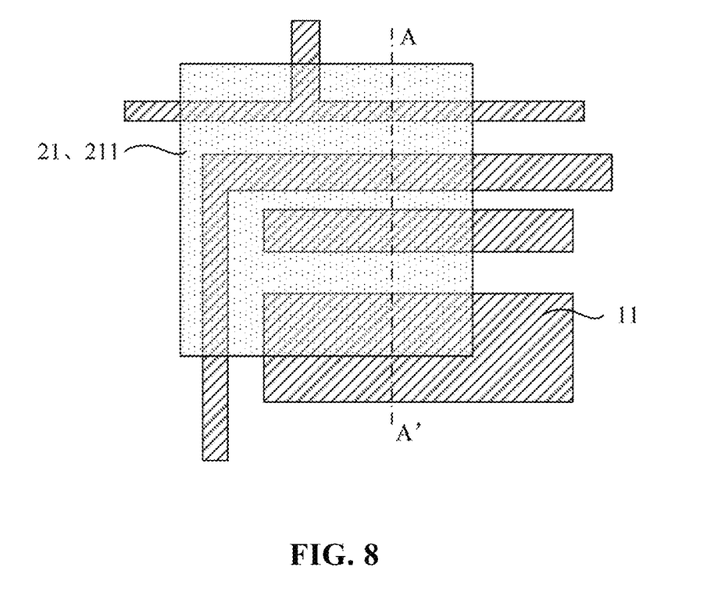
FIG. 8 is a schematic diagram illustrating a partial structure of a not-compensated pixel in a display substrate according to an embodiment of the present disclosure.

Referring to FIGS. 8 and 9, the anode 21 of the light-emitting device 2, which is not required to be compensated, has only the main body part 211.

Figure 10:
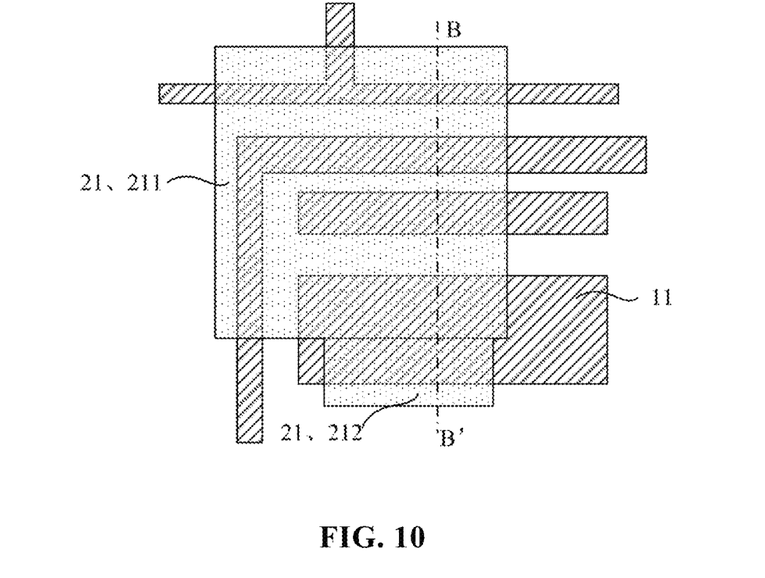
FIG. 10 is a schematic diagram illustrating a partial structure of a compensated pixel in a display substrate according to an embodiment of the present disclosure.

Referring to FIGS. 10 and 11, the anode 21 of the light-emitting device 2, which requires a larger coupling capacitance value (in other words, is required to be compensated), further includes a compensation part 212 connected to the main body part 211 and not in contact with the light-emitting layer 23, and the larger the area of the compensation part 212 is, the larger the coupling capacitance value of the anode 21 is.

That is, the coupling capacitance value can be adjusted by "adding" a compensation part 212 with a specific area to each of the anodes 21 of some of the light-emitting devices 2.

The compensation part 212 not in contact with the light-emitting layer 23 may be arranged in various manners.

For example, referring to FIGS. 8 to 11, the anodes 21 of the different light-emitting devices 2 in the display substrate may be independent from each other, while the light-emitting layers 23 and the cathodes 22 of the different light-emitting devices 2 may each be respectively connected into a "layer structure" of one piece, and the different light-emitting devices 2 are separated by the pixel defining layer 18 (PDL). Thus, the above described compensation part 212 of the anode 21 may be disposed below the pixel defining layer 18 (i.e., on the side close to the base substrate 9), while the light-emitting layer 23 and the cathode 22 are disposed above the pixel defining layer 18 (i.e., on the side away from the base substrate 9), so that the compensation part 212 of the anode 21 overlaps but does not contact with the light-emitting layer 23.

It should be understood that, FIGS. 8 to 11 only schematically illustrate the position relationship between the anode 21 and the potential capacitor structure 11, and do not mean that the structure shown in the figures represents the actual relationship between the anode 21 and the potential capacitor structure 11.

Alternatively, there are various specific manners to change the coupling capacitance value of the anode 21 of the light-emitting device 2, and the present disclosure is not limited to the change of the overlapping area between the anode 21 and the potential capacitor structure 11.

For example, a distance between the potential capacitor structure 11 and the anode 21 may be increased/decreased (for example, a thickness of at least one insulating layer 19 between the potential capacitor structure 11 and the anode 21 is changed, or the number of the at least one insulating layers 19 between the potential capacitor structure 11 and the anode 21 is increased/decreased) to change the coupling capacitance value of the anode 21 of the light-emitting device 2.

Alternatively, a dielectric coefficient of the at least one insulating layer 19 between the potential capacitor structure 11 and the anode 21 may be increased/decreased (e.g., a material of the insulating layer 19 is changed) to change the coupling capacitance value of the anode 21 of the light-emitting device 2.

In some embodiments, the cathode 22 of the light-emitting device 2 is provided on the side of the anode 21 away from the base substrate 9.

The potential capacitor structure 11, the orthographic projection of which has an overlap with the orthographic projection of the anode 21 of the light-emitting device 2, is located between the anode 21 and the base substrate 9, and is separated from the anode 21 by the at least one insulating layer 19.

Referring to FIGS. 9 and 11, in view of simplifying the structure, a plurality of potential capacitor structures 11 are usually formed on the base substrate 9 in the above driving circuit, and then the at least one insulating layer 19, the pixel defining layer 18, the anode 21, the light-emitting layer 23, the cathode 22, etc. are sequentially formed. Therefore, the above described potential capacitor structures 11 are usually located between the anode 21 and the base substrate 9, and the cathode 22 is located above the anode 21 (i.e. on the side away from the base substrate 9).

Alternatively, since the potential capacitor structure 11 is insulated from the anode 21, the at least one insulating layer 19 (such as a gate insulating layer, a passivation layer, an interlayer insulating layer, or a planarization layer, etc.) is necessarily disposed between the potential capacitor structure 11 and the anode 21 at least at the position that the potential capacitor structure 11 overlap with the anode 21.

It should be understood that different potential capacitor structures 11 may be located in different layers, and the number of the at least one insulating layer 19 between the different potential capacitor structures 11 and the anode 21 may be different.

In a second aspect, referring to FIGS. 1 to 11, an embodiment of the present disclosure provides a display panel, including:

any one of the above described display substrates.

That is, the display substrate may be combined with other devices (such as an opposed cover plate, a driving chip, a power supply, etc.) to form a display panel with complete display function.

Specifically, the display panel may be any product or component with a display function, such as an electronic paper, a mobile phone, a tablet computer, a television, a monitor, a laptop, a digital photo frame, a navigator and the like.

In some embodiments, the display panel of embodiments of the present disclosure further includes:

a driving chip, which is provided with an anode port electrically connected to the anode connector 5 of the display substrate.

To provide the anode connector 5 with an anode voltage, a driving chip (IC) may be connected (e.g., bonded or connected via a flexible circuit board) to the display substrate, and the anode connector 5 on the display substrate may be electrically connected to a corresponding anode port of the driving chip.

Thus, the position away from/close to the anode connector 5 described above is actually the position away from/close to the IC.

The present disclosure has disclosed example embodiments, and although specific terms are employed, they are used and should be interpreted in a generic and descriptive sense only and not for purposes of limitation. In some instances, features, characteristics and/or elements described in connection with a particular embodiment may be used alone or in combination with features, characteristics and/or elements described in connection with other embodiments, unless expressly stated otherwise, as would be apparent to one skilled in the art. It will, therefore, be understood by one of ordinary skill in the art that various changes in form and details may be made therein without departing from the scope of the present disclosure as set forth in the appended claims.

What is claimed is:

1. A display substrate, comprising:
a plurality of pixels comprising light-emitting devices, wherein at least a portion of the plurality of pixels each comprise a light-emitting device of a first color, which comprises a cathode and an anode; and
an anode connector for supplying power to the anode of each of the light-emitting devices through an anode line, a total resistance of the anode line connected between the light-emitting device and the anode connector being a supply resistance of this light-emitting device, wherein
coupling capacitance values of the anodes of at least some of the light-emitting devices of the first color are different; for any two light-emitting devices of the first color having the anodes with different coupling capacitance values, the supply resistance of the light-emitting device having the anode with a larger coupling capacitance value is smaller than the supply resistance of the light-emitting device having the anode with a smaller coupling capacitance value.

2. The display substrate of claim 1, wherein
the display substrate is divided into n compensation regions, each of which comprises a plurality of light-emitting devices of the first color, wherein n is an integer greater than or equal to 2;
coupling capacitance values of the anodes of the light-emitting devices of the first color in a same compensation region are the same; and
a maximum value of the supply resistance of the light-emitting device of the first color in the $i^{th}$ compensation region is smaller than a minimum value of a supply resistance of the light-emitting device of the first color in the $(i+1)^{th}$ compensation region; a coupling capacitance value of the anode of the light-emitting device of the first color in the $i^{th}$ compensation region is greater than a coupling capacitance value of the anode of the light-emitting device of the first color in the $(i+1)^{th}$ compensation region; wherein i is any integer greater than 0 and less than n.

3. The display substrate of claim 2, wherein
all of the plurality of pixels are arranged in a display area, and the anode connector is arranged outside one side of the display area; and
the $i^{th}$ compensation region and the $(i+1)^{th}$ compensation region are separated by a boundary, the $i^{th}$ compensation region is on a side of the boundary close to the anode connector, and the $(i+1)^{th}$ compensation region is on a side of the boundary away from the anode connector.

4. The display substrate of claim 3, wherein
an area of the anode of any of the light-emitting devices of the first color in the $i^{th}$ compensation region is larger than an area of the anode of any of the light-emitting devices of the first color in the $(i+1)^{th}$ compensation region.

5. The display substrate of claim 2, wherein
n is equal to 3.

6. The display substrate of claim 1, wherein
the light-emitting device is an organic light-emitting diode.

7. The display substrate of claim 6, wherein
the first color is red.

8. The display substrate of claim 1, wherein
the display substrate further comprises a plurality of light-emitting devices of other colors different from the first color; and
coupling capacitance values of the anodes of the light-emitting devices of a same color of the other colors, except for the light-emitting devices of the first color, are the same.

9. The display substrate of claim 1, further comprising a base substrate, wherein
each of the plurality of pixels further comprises a driving circuit for driving the light-emitting device, the driving circuit comprising a plurality of conductive structures, and any conductive structure of the plurality of conductive structures insulated from the anode of the light-emitting device is a potential capacitor structure;
in each of the plurality of pixels, an orthographic projection of the anode of the light-emitting device on the base substrate overlaps an orthographic projection of at least a part of the potential capacitor structure on the base substrate; and
for any two light-emitting devices of the first color having the anodes with different coupling capacitance values, an overlapping area between the orthographic projection of the anode of the light-emitting device, with a larger coupling capacitance value of the anode, and the orthographic projection of the potential capacitor structure, is larger than an overlapping area between the orthographic projection of the anode of the light-emitting device, with a smaller coupling capacitance value of the anode, and the orthographic projection of the potential capacitor structure.

10. The display substrate of claim 9, wherein
throughout all the pixels where the light-emitting devices of the first color are located, shapes of the orthographic projections of the potential capacitor structures on the base substrate are the same; and
for any two light-emitting devices of the first color with different coupling capacitance values of the anodes, an area of the orthographic projection of the anode, which has a larger coupling capacitance value, of the light-emitting device on the base substrate, is larger than an area of the orthographic projection of the anode, which has a smaller coupling capacitance value, of the light-emitting device on the base substrate.

11. The display substrate of claim 10, wherein
each of the light-emitting devices further comprises a light-emitting layer between the cathode and the anode, and the anodes of all the light-emitting devices each comprise a main body part in contact with the light-emitting layer;
shapes of the main body parts of the anodes of all the light-emitting devices of the first color are the same; and
except the anode, which has a smallest coupling capacitance value, of the light-emitting device of the first color, each of the anodes of the light-emitting devices of the first colors comprises a compensation part extending outward from an edge of the main body part, and the larger the coupling capacitance value of the anode of the light-emitting device is, the larger the area of the compensation part corresponding to the light-emitting device is.

12. The display substrate of claim 9, wherein
the cathode of the light-emitting device is arranged on a side of the anode away from the base substrate; and
the potential capacitor structure, the orthographic projection of which has an overlap with the orthographic projection of the anode of the light-emitting device, is located between the anode and the base substrate, and is separated from the anode by at least one insulating layer.

13. A display panel, comprising:
the display substrate of claim 1.

14. The display panel of claim 13, further comprising:
a driving chip having an anode port electrically connected to the anode connector of the display substrate.

15. The display panel of claim 13, wherein
the display substrate is divided into n compensation regions, each of which comprises a plurality of light-emitting devices of the first color, wherein n is an integer greater than or equal to 2;
coupling capacitance values of the anodes of the light-emitting devices of the first color in a same compensation region are the same; and
a maximum value of the supply resistance of the light-emitting device of the first color in the $i^{th}$ compensation region is smaller than a minimum value of a supply resistance of the light-emitting device of the first color in the $(i+1)^{th}$ compensation region; a coupling capacitance value of the anode of the light-emitting device of the first color in the $i^{th}$ compensation region is greater than a coupling capacitance value of the anode of the light-emitting device of the first color in the $(i+1)^{th}$ compensation region; wherein i is any integer greater than 0 and less than n.

16. The display panel of claim 15, wherein
all of the plurality of pixels are arranged in a display area, and the anode connector is arranged outside one side of the display area; and
the $i^{th}$ compensation region and the $(i+1)^{th}$ compensation region are separated by a boundary, the $i^{th}$ compensation region is on a side of the boundary close to the anode connector, and the $(i+1)^{th}$ compensation region is on a side of the boundary away from the anode connector.

17. The display panel of claim 16, wherein
an area of the anode of any of the light-emitting devices of the first color in the $i^{th}$ compensation region is larger than an area of the anode of any of the light-emitting devices of the first color in the $(i+1)^{th}$ compensation region.

18. The display panel of claim 15, wherein
n is equal to 3.

19. The display panel of claim 13, wherein
the light-emitting device is an organic light-emitting diode.

20. The display panel of claim 19, wherein
the first color is red.

* * * * *